United States Patent
Lin et al.

(10) Patent No.: US 12,119,261 B2
(45) Date of Patent: Oct. 15, 2024

(54) SEMICONDUCTOR STRUCTURE AND MANUFACTURING METHOD OF THE SAME

(71) Applicant: Winbond Electronics Corp., Taichung (TW)

(72) Inventors: Chun-Hung Lin, Taichung (TW); Kao-Tsair Tsai, Taichung (TW); Chung-Hsien Liu, Taichung (TW); Tz-Hau Guo, Taichung (TW); Yen-Jui Chu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 444 days.

(21) Appl. No.: 17/712,461

(22) Filed: Apr. 4, 2022

(65) Prior Publication Data

US 2023/0317520 A1    Oct. 5, 2023

(51) Int. Cl.
*H01L 21/768* (2006.01)
*H01L 21/8234* (2006.01)

(52) U.S. Cl.
CPC .. *H01L 21/76897* (2013.01); *H01L 21/76816* (2013.01); *H01L 21/76834* (2013.01); *H01L 21/823475* (2013.01)

(58) Field of Classification Search
None
See application file for complete search history.

(56) References Cited

U.S. PATENT DOCUMENTS

| | | | |
|---|---|---|---|
| 5,760,429 A | 6/1998 | Yano | |
| 6,559,542 B1 * | 5/2003 | Oda | H01L 23/5226 257/E23.145 |
| 7,807,569 B2 | 10/2010 | Park | |
| 2015/0035057 A1 | 2/2015 | Jung | |
| 2021/0313281 A1 * | 10/2021 | Kaminaga | H10B 43/10 |
| 2023/0371407 A1 * | 11/2023 | Liu | H10B 63/80 |

FOREIGN PATENT DOCUMENTS

| | | | | |
|---|---|---|---|---|
| DE | 102014117297 A1 * | 5/2015 | | H01L 21/26586 |
| JP | 2002141485 A * | 5/2002 | | H01L 21/02164 |
| JP | 2008071861 A * | 3/2008 | | |

* cited by examiner

*Primary Examiner* — Michael Lebentritt
(74) *Attorney, Agent, or Firm* — Muncy, Geissler, Olds & Lowe, P.C.

(57) ABSTRACT

A manufacturing method for a semiconductor structure is provided. First active areas, a second active area, and a third active area are formed. A first dielectric layer is formed on the active areas. A patterned region that includes a cavity region and a dielectric region is formed in the first dielectric layer, and the cavity region surrounds the dielectric region. A filling layer is formed in the cavity region. Multiple first contact holes and at least one second contact hole that penetrate the first dielectric layer are formed. Each first contact hole exposes a portion of the corresponding first active area, and the second contact hole replaces the dielectric region and exposes a portion of the second active area. Metal layers are filled in to the first contact holes and the second contact hole.

19 Claims, 10 Drawing Sheets

SEMICONDUCTOR STRUCTURE AND MANUFACTURING METHOD OF THE SAME

BACKGROUND

Technical Field

Embodiments of the present disclosure relate to a semiconductor structure and a manufacturing method of the same, and in particular they relate to a manufacturing method capable of reducing the process steps for forming contact holes and a semiconductor structure formed therefrom.

Description of the Related Art

In the process of manufacturing the semiconductor structure, multiple processes are often required to complete the connection of the through holes, which is not only time-consuming but also requires high alignment accuracy. In order to avoid creating open circuits due to poor alignment, the widths of some contact holes and the metal connection lines that are filled into them are limited (e.g., they cannot be reduced). As semiconductor structures become more complex (e.g., the volume becomes smaller or the component density becomes larger), the manufacturing methods of semiconductor structures face more challenges.

SUMMARY

The embodiments of the present disclosure provide a manufacturing method for a semiconductor structure that may effectively reduce the number of processes for forming contact holes, thereby reducing the overall process time and cost. Moreover, the manufacturing method of the semiconductor structure according to the embodiments of the present disclosure may provide higher alignment tolerance, thereby effectively reducing the width of the contact hole and the connection line filled into it, so as to reduce the volume of the semiconductor structure and increase the density of the components.

Some embodiments of the present disclosure include a manufacturing method of a semiconductor structure. The manufacturing method of the semiconductor structure includes the following steps. Multiple first active areas, a second active area, and a third active area are formed. The first active areas define a cell region. The second active area and the third active area define a peripheral region. A first dielectric layer is formed on the first active areas, the second active area, and the third active area. A patterned region is formed in the first dielectric layer, wherein the patterned region includes a cavity region and a dielectric region, the cavity region surrounds the dielectric region, and the dielectric region corresponds to the second active area. A filling layer is formed in the cavity region. A cap layer is formed on the first dielectric layer. A second dielectric layer is formed on the cap layer. Multiple first contact holes and at least one second contact hole are formed. The first contact holes and the second contact hole penetrate the second dielectric layer, the cap layer, and the first dielectric layer. Each first contact hole exposes a portion of one of the first active areas. The second contact hole replaces the dielectric region and exposes a portion of the second active area. Multiple metal layers are formed in the first contact holes and the second contact hole.

Some embodiments of the present disclosure include a semiconductor structure. The semiconductor structure includes first active areas, a second active area, and a third active area. The first active areas define a cell region. The second active area and the third active area define a peripheral region. The semiconductor structure also includes a first dielectric layer and a cap layer, the first dielectric layer is disposed on the first active areas, the second active area, and the third active area, including a patterned region that corresponds to the second active area. The cap layer is disposed on the first dielectric layer. The semiconductor structure further includes a second dielectric layer disposed on the cap layer. Moreover, the semiconductor structure also includes multiple first metal layers and at least one second metal layer. The first metal layers penetrate the second dielectric layer, the cap layer, and the first dielectric layer and is electrically connected to the first active areas. The second metal layer penetrates the second dielectric layer, the cap layer, and the first dielectric layer and is electrically connected to the second active area.

DETAILED DESCRIPTION

Some components of the semiconductor structure 100 have been omitted in FIG. 1A to FIG. 8 for sake of brevity.

Figure 1A:
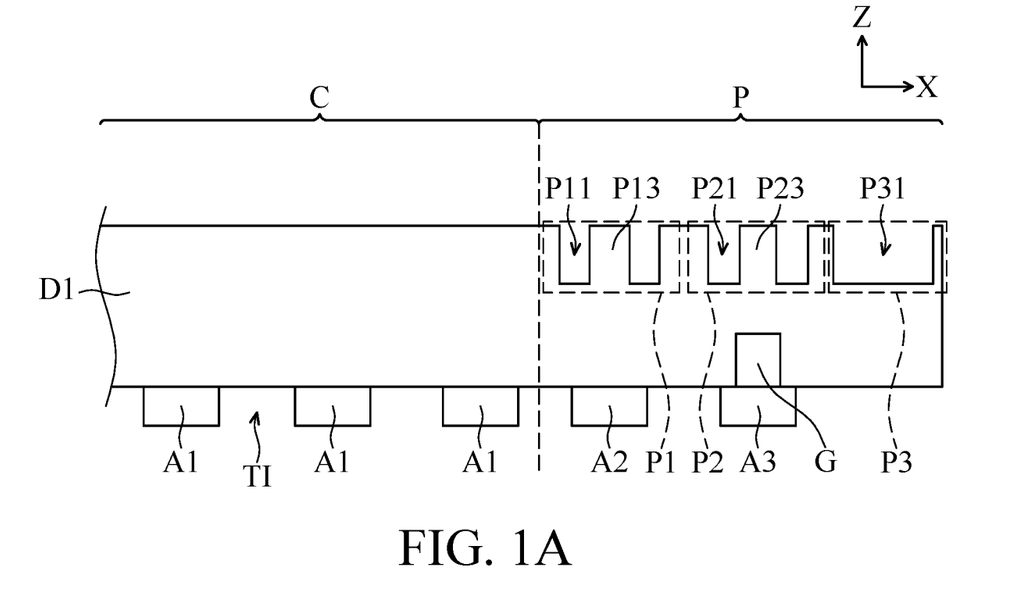
FIGS. 1A, 2, 3A, and 4-8 are partial cross-sectional views illustrating various stages of a method for manufacturing the semiconductor structure according to some embodiments of the present disclosure.

Referring to FIG. 1A, multiple first active areas A1, a second active area A2, and a third active area A3 are formed. The first active areas A1 define a cell region C of the semiconductor structure 100. The second active area A2 and the third active area A3 define a peripheral region of the semiconductor structure 100.

The first active areas A1, the second active area A2, and the third active area A3 may include conductive materials, such as metals, metal silicides, semiconductor materials, the like, or a combination thereof, but the present disclosure is not limited thereto.

The first active area A1, the second active area A2, and the third active area A3 may include various p-type doped regions and/or n-type doped regions formed by, for example, an ion implantation process and/or a diffusion process. The first active area A1, the second active area A2, and the third active area A3 may be formed by physical vapor deposition (PVD), chemical vapor deposition (CVD), atomic layer deposition (ALD), evaporation, sputtering, the like, or a combination thereof, but the present disclosure is not limited thereto.

Moreover, the first active area A1, the second active area A2, and the third active area A3 may be separated by various isolation features TI. For example, the isolation feature TI may include shallow trench isolation (STI). The step of forming the isolation features TI may include etching trenches and filling the trenches with insulating material (e.g., silicon oxide, silicon nitride, or silicon oxynitride).

In some embodiments, a gate structure G is formed on the third active area A3. For example, the gate structure G may include conductive materials, such as metals, metal silicides, the like, or a combination thereof. The gate structure G may be formed by PVD, CVD, ALD, evaporation, sputtering, the like, or a combination thereof.

In some embodiments, a first dielectric layer D1 is formed on the first active areas A1, the second active area A2, and the third active area A3. The first dielectric layer D1 may include any suitable dielectric material, such as silicon oxide, silicon nitride, silicon oxynitride, low-κ dielectric material, aluminum oxide, aluminum nitride, the like, or a combination thereof, but the present disclosure is not limited thereto. In addition, the first dielectric layer D1 may be formed by, for example, a deposition process, such as a CVD process, an ALD process, a spin-on coating process, a similar deposition process, or a combination thereof.

Figure 1B:
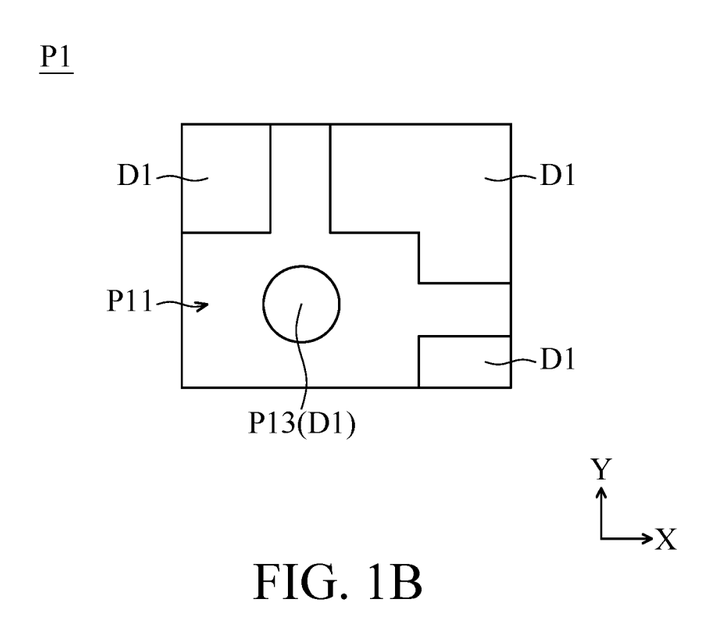
FIG. 1B is a top view that corresponds to a portion of the structure in FIG. 1A.

Referring to FIG. 1A, a patterned region P1 and a patterned region P2 are formed in the first dielectric layer D1. The patterned region P1 corresponds to the second active area A2, and the patterned region P2 corresponds to the gate structure G (or the third active area A3). Specifically, the first dielectric layer D1 is patterned to form the patterned region P1 and the patterned region P2. FIG. 1B may be, for example, a partial top view that corresponds to the patterned region P1 in FIG. 1A. It should be noted that FIG. 1B may also be, for example, a partial top view that corresponds to the patterned region P2 in FIG. 1A. In other words, the patterned region P1 may have the same or similar structure to the patterned region P2.

Referring to FIG. 1A and FIG. 1B, the patterned region P1 includes a cavity region P11 and a dielectric region P13, the cavity region P11 surrounds the dielectric region P13, and the dielectric region P13 corresponds to the second active area A2. In other words, the dielectric region P13 of the patterned region P1 and the second active region A2 at least partially overlap. Similarly, as shown in FIG. 1A, the patterned region P2 includes a cavity region P21 and a dielectric region P23, the cavity region P21 surrounds the dielectric region P23, and the dielectric region P23 corresponds to the gate structure G (or the third active area A3). In other words, the dielectric region P23 of the patterned region P2 and the third active region A3 at least partially overlap.

Moreover, as shown in FIG. 1A, a patterned region P3 is further formed in the first dielectric layer D1, and the patterned region P3 includes a cavity region P31. Specifically, the first dielectric layer D1 is patterned to form the patterned region P3. For example, the patterned region P1, the patterned region P2, and the patterned region P3 may be simultaneously formed by the same (patterning) process, but the present disclosure is not limited thereto.

In some embodiments, a mask layer (not shown) is arranged on the first dielectric layer D1 through a patterning process, and then an etching process is performed using the mask layer as an etching mask, to form the patterned region P1, the patterned region P2, and/or the patterned region P3 (i.e., the first dielectric layer D1 is etched to form the cavity region P11, the cavity region P21, and/or the cavity region P31). The mask layer may include a hard mask such as silicon oxide (SiO$_2$), silicon nitride (SiN), silicon oxynitride (SiON), silicon carbide (SiC), silicon carbide nitride (SiCN), similar materials, or a combination thereof. The mask layer may be a single-layer structure or a multi-layer structure.

The mask layer may be formed by, for example, a deposition process, a lithography process, any other suitable process, or a combination thereof. Examples of the deposition process are described above and will not be repeated here. The lithography process may include, for example, photoresist coating (e.g., spin-on coating), soft baking, mask aligning, exposure, post-exposure baking (PEB), developing, rinsing, drying (e.g., hard baking), any other suitable process, or a combination thereof.

Figure 2:
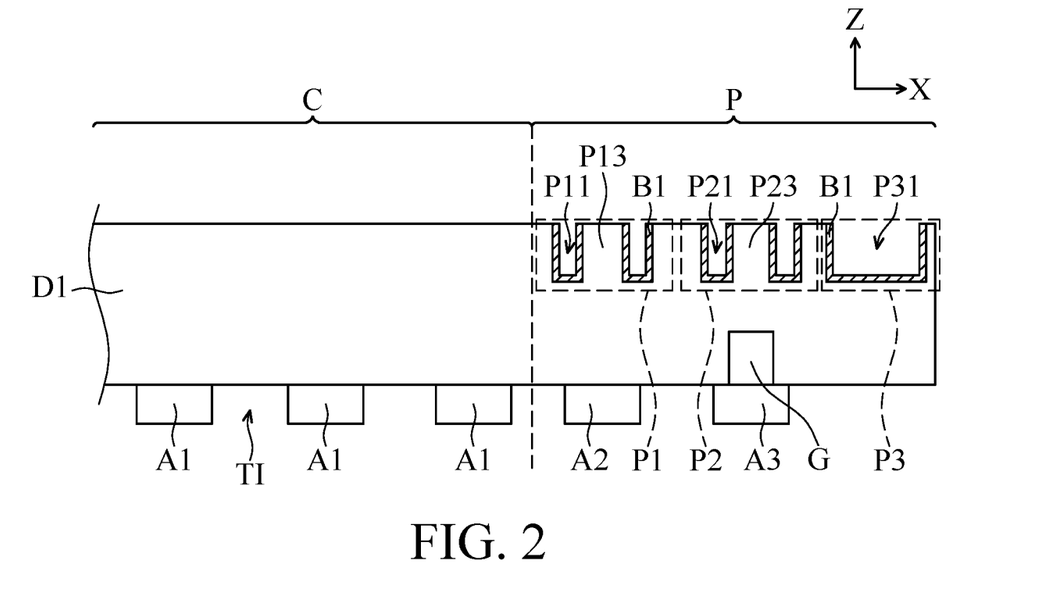

Referring to FIG. 2, a first barrier layer B1 is formed in the cavity region P11, the cavity region P21, and the cavity region P31. Specifically, the first barrier layer B1 may be formed on the sidewall and the bottom of the cavity region P11 of the patterned region P1, the sidewall and the bottom of the cavity region P21 of the patterned region P2, and the sidewall and the bottom of the cavity region P31 of the patterned region P3. In this embodiment, the first barrier layer B1 includes titanium (Ti) or titanium nitride (TiN). In addition, the first barrier layer B1 may be formed by a deposition process, but the present disclosure is not limited thereto. Examples of the deposition process are described above and will not be repeated here.

Figure 3A:
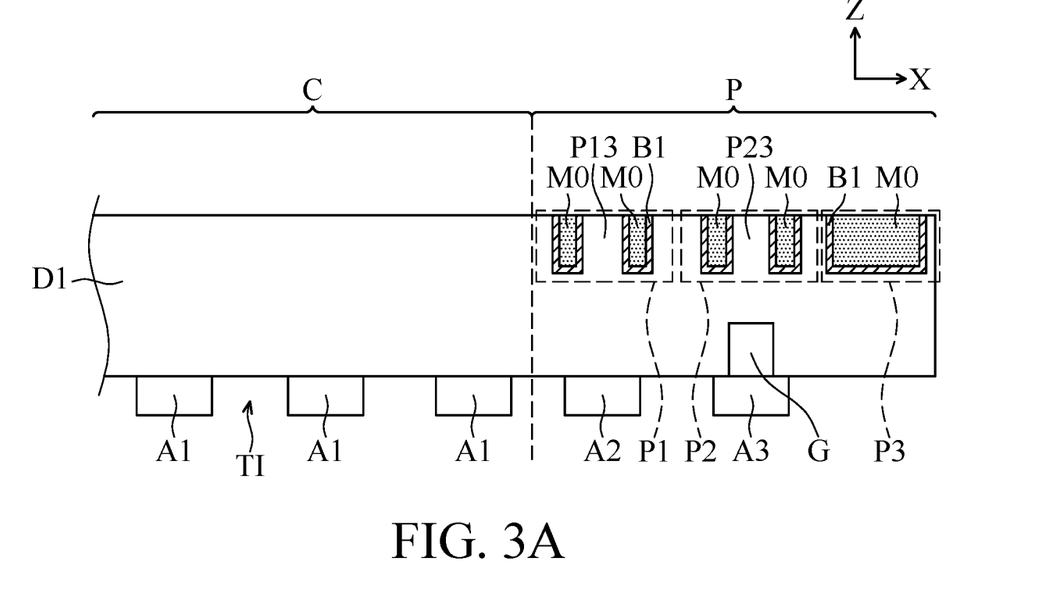
Figure 3B:
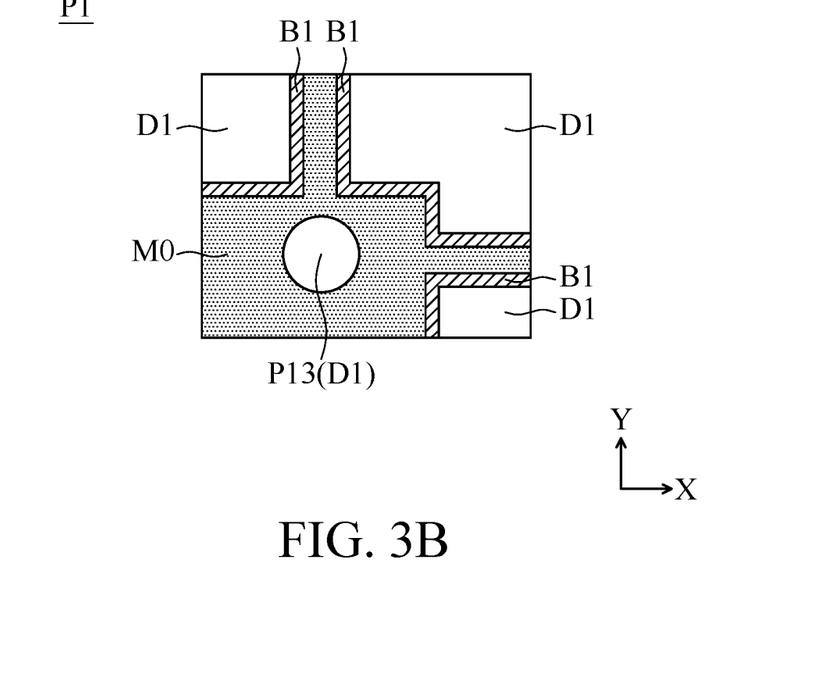
FIG. 3B is a top view that corresponds to a portion of the structure in FIG. 3A.

Referring to FIG. 2, FIG. 3A, and FIG. 3B, a filling layer M0 is formed in the cavity region P11, the cavity region P21, and the cavity region P31. The filling layer M0 is formed on the first barrier layer B1 and fills the cavity region P11 of the patterned region P1, the cavity region P21 of the patterned region P2, and the cavity region P31 of the patterned region P3. In this embodiment, the filling layer M0 includes tungsten (W). The filling layer M0 may be formed by a deposition process, but the present disclosure is not limited thereto. Examples of the deposition process is described above and will not be repeated here.

After the first barrier layer B1 and the filling layer M0 are formed, a planarization process may be performed. For example, a chemical mechanical polishing (CMP) process may be performed, so that the top surface of the first dielectric layer D1, the top surface of the patterned region P1, the top surface of the patterned region P2, and the top surface of the patterned region P3 are coplanar. That is, the topmost surface of the first barrier layer B1 and the topmost surface of the filling layer M0 may be coplanar with the top surface of the first dielectric layer D1 (i.e., may not exceed the top surface of the first dielectric layer D1), but the present disclosure is not limited thereto.

Figure 4:
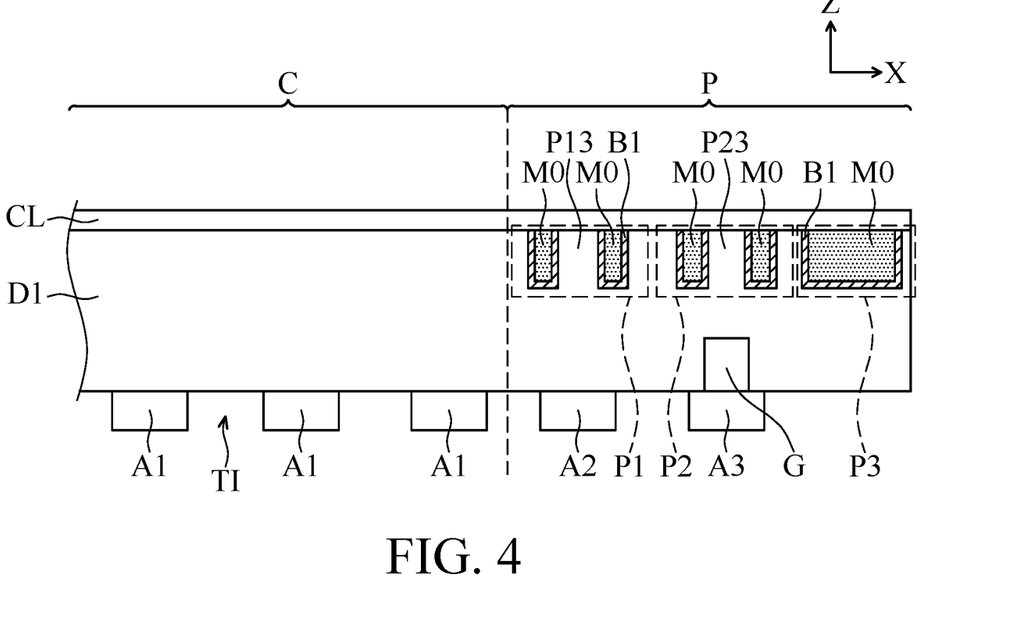

Referring to FIG. 4, a cap layer CL is formed on the first dielectric layer D1. For example, the cap layer CL may be formed by a deposition process, but the present disclosure is not limited thereto. Examples of the deposition process are described above and will not be repeated here. The cap layer CL may include any suitable dielectric material, such as silicon oxide, silicon nitride, silicon oxynitride, low-κ dielectric material, aluminum oxide, aluminum nitride, the like, or a combination thereof, but the present disclosure is not limited thereto. It should be noted that the material of the cap layer CL is different from the material of the first dielectric layer D1, so that in the subsequent etching process, the etching rate of the cap layer CL and the etching rate of the first dielectric layer D1 are different (i.e., they have etching selectivity).

Figure 5:
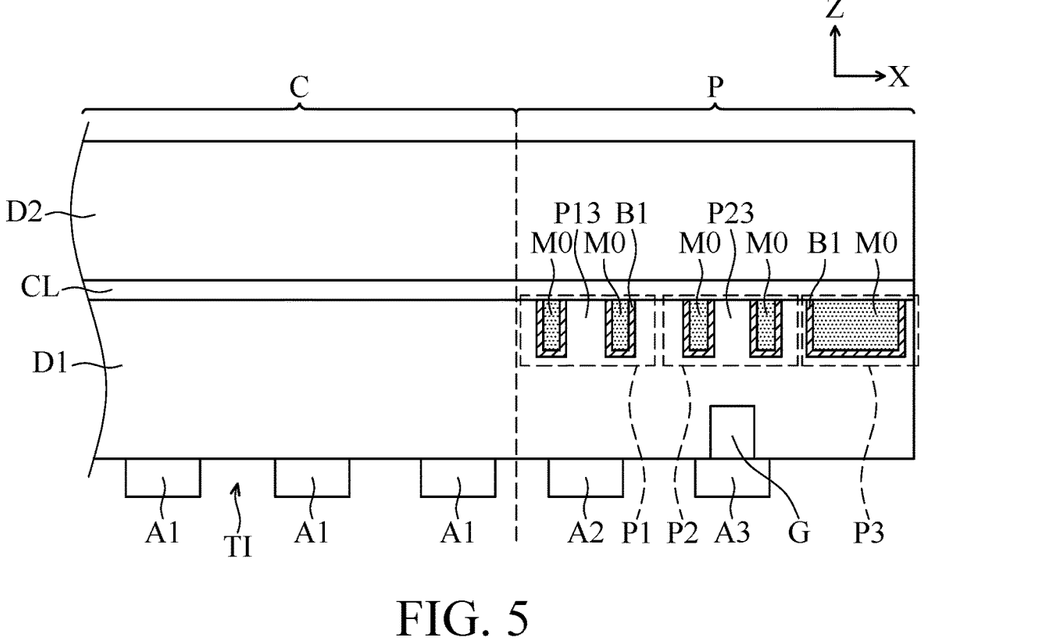

Referring to FIG. 5, a second dielectric layer D2 is formed on the cap layer CL. The material and manufacturing method of the second dielectric layer D2 may be the same as or similar to that of the first dielectric layer D1, which will not be repeated here, but the present disclosure is not limited thereto.

Figure 6:
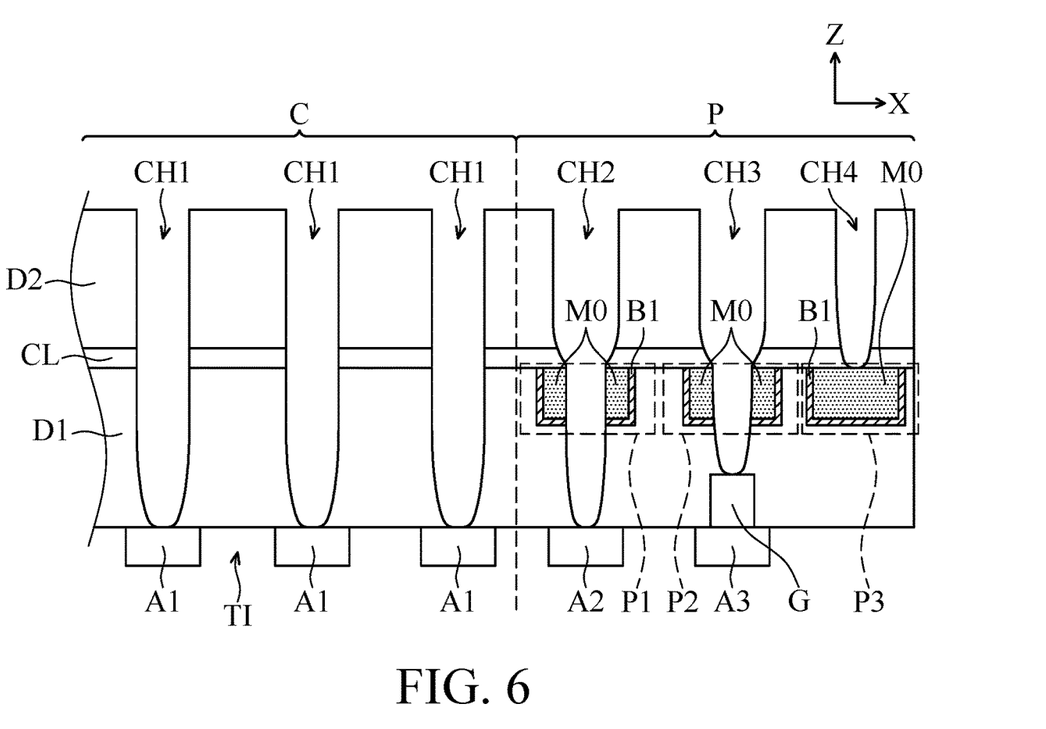

Referring to FIG. 6, multiple first contact holes CH1 and a second contact hole CH2 are formed. For example, a patterning process may be performed to form the first contact holes CH1 and the second contact hole CH2, but the present disclosure is not limited thereto. Examples of the patterning process are as described above and will not be repeated here. In some embodiments, the first contact holes CH1 and the second contact hole CH2 all penetrate the second dielectric layer D2, the cap layer CL, and the first dielectric layer D1. Each first contact hole CH1 exposes a portion of the corresponding first active area, and the second contact hole further replaces the dielectric region P13 of the pattered region P1 and exposes a portion of the second active area A2.

Similarly, a third contact hole CH3 and a fourth contact hole CH4 are formed. For example, a patterning process may be performed to simultaneously form the first contact holes CH1, the second contact hole CH2, the third contact hole CH3, and the fourth contact hole CH4, but the present disclosure is not limited thereto. The third contact hole CH3 penetrates the second dielectric layer D2, the cap layer CL, and a portion of the first dielectric layer D1, replaces the dielectric region P23 of the pattered region P2, and exposes a portion of the gate structure G. The fourth contact hole CH4 penetrates the second dielectric layer D2 and the cap layer CL, and exposes a portion of the filling layer M0 filled in to the cavity region P31 of the patterned region P3.

Figure 7:
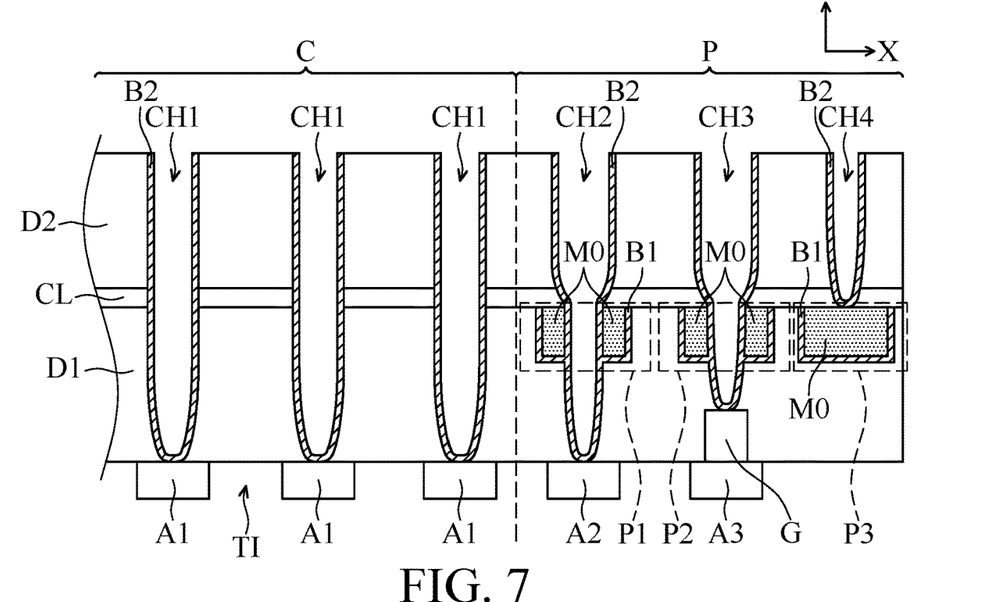

Referring to FIG. 7, a second barrier layer B2 is formed in the first contact holes CH1, the second contact hole CH2, the third contact hole CH3, and the fourth contact hole CH4. Specifically, the second barrier layer B2 may be formed on the sidewalls of the first contact holes CH1, the second contact hole CH2, the third contact hole CH3, and the fourth contact hole CH4. The material and manufacturing method of the second barrier layer B2 may be the same as or similar to that of the first barrier layer B1, which will not be repeated here, but the present disclosure is not limited thereto.

Figure 8:
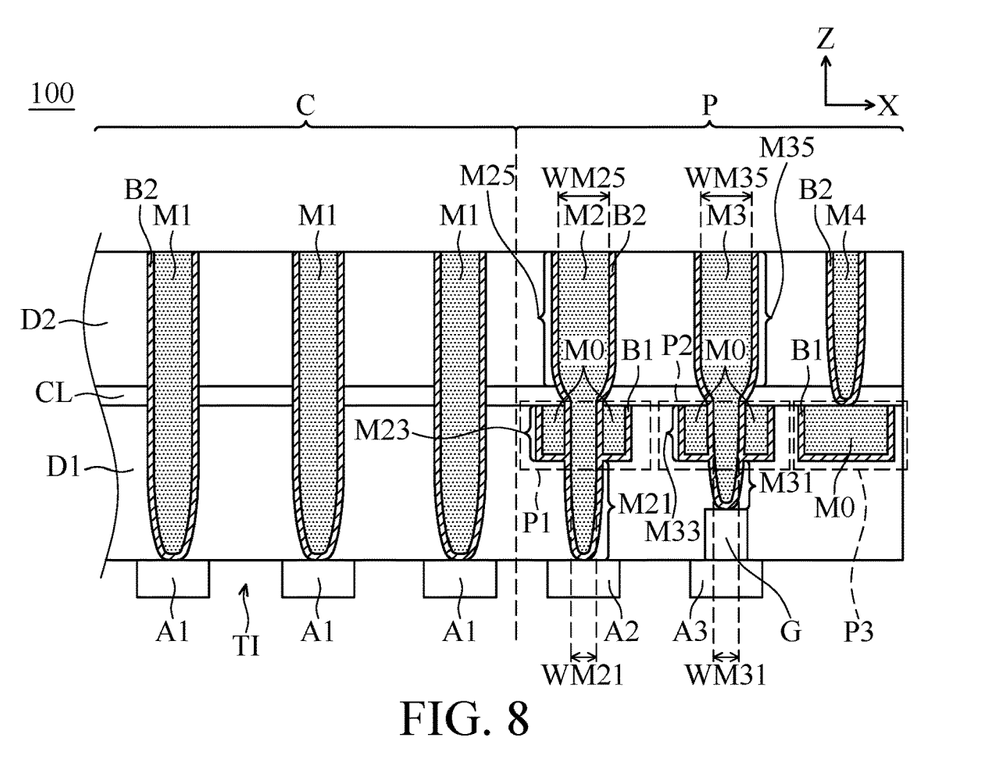

Referring to FIG. 8, metal layers are filled in to the first contact holes CH1, the second contact hole CH2, the third contact hole CH3, and the fourth contact hole CH4. Specifically, the metal layers include first metal layers M1, a second metal layer M2, a third metal layer M3, and a fourth metal layer M4, which are respectively formed in the first contact holes CH1, the second contact hole CH2, the third contact hole CH3, and the fourth contact hole CH4. In other words, the first metal layers M1 are formed on the second barrier layer B2 and fill the first contact holes CH1; the second metal layer M2 is formed on the second barrier layer B2 and fills the second contact hole CH2; the third metal layer M3 is formed on the second barrier layer B2 and fills the third contact hole CH3; the fourth metal layer M4 is formed on the second barrier layer B2 and fills the fourth contact hole CH4.

As shown in FIG. 8, a portion of the second barrier layer B2 is between the second metal layer M2 and the filling layer M0. Alternatively, a portion of the second barrier layer B2 is between the third metal layer M3 and the filling layer M0. In other words, the filling layer M0 is between the first barrier layer B1 and the second barrier layer B2. In more detail, the first barrier layer B1 and the second barrier layer B2 cover the sidewalls and the bottom of the filling layer M0, but the present disclosure is not limited thereto.

In this embodiment, the first metal layers M1, the second metal layer M2, the third metal layer M3, and the fourth metal layer M4 include tungsten (W). In addition, the first metal layers M1, the second metal layer M2, the third metal layer M3, and the fourth metal layer M4 may be formed by a deposition process, but the present disclosure is not limited thereto.

As shown in FIG. 8, the first metal layers M1 penetrate the second dielectric layer D2, the cap layer CL, and the first dielectric layer D1, and are electrically connected to the first active areas A1; the second metal layer M2 penetrates the second dielectric layer D2, the cap layer CL, and the first dielectric layer D1, and is electrically connected to the second active areas A2; the third metal layer M3 penetrates the second dielectric layer D2, the cap layer CL, and a portion of the first dielectric layer D1, and is (electrically) connected to the gate structure G.

The first barrier layer B1 is disposed on the sidewall and at least a portion of bottom of the patterned region P1, the sidewall and at least a portion of bottom of the patterned region P2, and/or the sidewall and bottom of the patterned region P3. The second barrier layer B2 is disposed on the sidewall of each first metal layer M1, at least part of the sidewalls of the second metal layer M2 and the third metal layer M3, and/or the sidewall of the fourth metal layer M4. In other words, in the patterned region P1, the filling layer M0 is disposed between the second metal layer M2 and the first barrier layer B1; in the patterned region P2, the filling layer M0 is disposed between the third metal layer M3 and the first barrier layer B1; in the patterned region P3, the first barrier layer B1 covers the sidewall and the bottommost of the filling layer M0, but the present disclosure is not limited thereto.

As shown in FIG. 8, each first metal layer M1 has a substantially constant width. It should be noted that the bottom of the first metal layer M1 may be gradually narrowed due to process factors (the bottom of the first contact hole CH1 converges). However, other portions of the first metal layer M1 still maintain substantially the same width.

The second metal layer M2 includes a first connection portion M21, a filling portion M23, and a second connection portion M25, the first connection portion M21 is connected to the second active area A2, the filling portion M23 is filled in to the patterned region P1 and connected to the first connection portion M21, and the second connection portion M25 is disposed on the filling portion M23 and connected to the filling portion M23. In other words, the second connection portion M25 of the second metal layer M2 may be electrically connected to the first connection portion M21 by the filling portion M23. In some embodiments, the width WM25 of the second connection portion M25 is greater than the width WM21 of the first connection portion M21. As shown in FIG. 8, the second barrier layer B2 is disposed on the sidewalls of the first connection portion M21 and the second connection portion M25. In this embodiment, the second barrier layer B2 is further disposed on the sidewall of the filling portion M23, but the present disclosure is not limited thereto.

Similarly, the third metal layer M3 includes a first connection portion M31, a filling portion M33, and a second connection portion M35, the first connection portion M31 is connected to the gate structure G, the filling portion M33 is filled in to the patterned region P2 and connected to the first connection portion M31, and the second connection portion M35 is disposed on the filling portion M33 and connected to the filling portion M33. In other words, the second connection portion M35 of the second metal layer M3 may be electrically connected to the first connection portion M31 by the filling portion M33. In some embodiments, the width WM35 of the second connection portion M35 is greater than the width WM31 of the first connection portion M31. As shown in FIG. 8, the second barrier layer B2 is disposed on the sidewalls of the first connection portion M31 and the second connection portion M35. In this embodiment, the second barrier layer B2 is further disposed on the sidewall of the filling portion M33, but the present disclosure is not limited thereto.

Compared with the conventional method of manufacturing a semiconductor structure, in the manufacturing method of the semiconductor structure 100 according to the embodiments of the present disclosure, the contact holes may be formed by a smaller number of processes, thereby reducing the overall process time and cost. Furthermore, since the second connection portion M25 of second metal layer M2 may be electrically connected to the first connection portion M21 by the filling portion M23, a higher alignment tolerance may be provided, and the possibility of open circuit may be effectively reduced.

Figure 9:
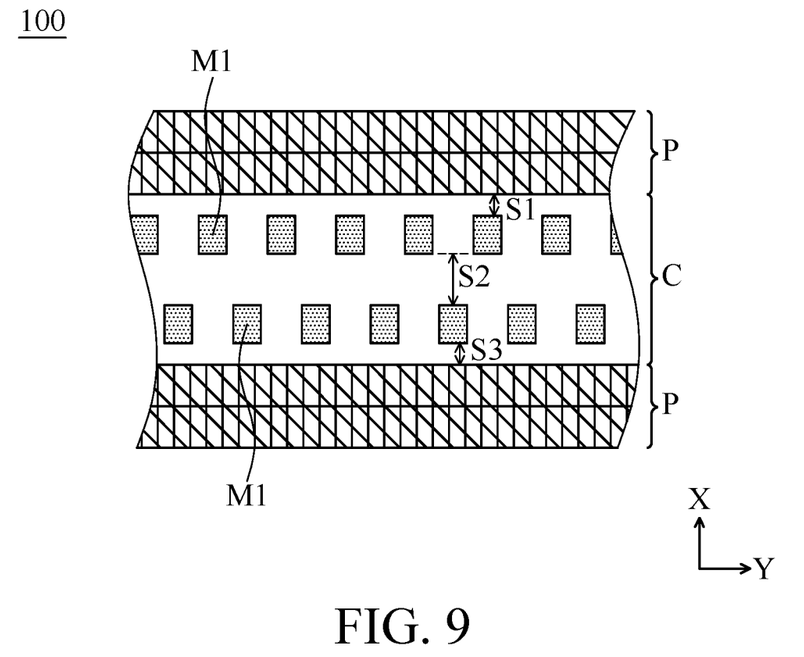
FIG. 9 is a partial top view illustrating the semiconductor structure according to some embodiments of the present disclosure.

FIG. 9 is a partial top view illustrating the semiconductor structure 100 according to some embodiments of the present disclosure. Conventionally, in the process of manufacturing a semiconductor structure, multiple processes are required to complete the connection of the contact holes. Therefore, the first metal layer M1 of the general semiconductor structure is formed in sections and has different widths. In contrast, as shown in FIG. 8 and FIG. 9, in some embodiments of the present disclosure, the first contact hole CH1 in the cell region C directly penetrates the second dielectric layer D2, the cap layer CL, and the first dielectric layer D1 by one patterning process, so that each first metal layer M1 has a substantially constant width. Therefore, the width of the first contact hole CH1 and the connection line filled therein (i.e., the first metal layer M1) may be effectively shortened.

Moreover, since the contact holes may be formed at one time, alignment marks added for alignment may be reduced. Furthermore, compared with the prior art in which the contact hole and the metal layer are formed by at least two patterning processes and filling (e.g., deposition) processes and the overall width (e.g., the top width) of the formed metal layer is larger, as shown in FIG. 9, by the method according to the embodiments of the present disclosure, the overall width of the first metal layer M1 may be further reduced. Therefore, the distances S1 and S3 between the first metal layer M1 and the peripheral region P and the distance S2 between two adjacent first metal layers M1 in the X-direction are shortened, thereby reducing the volume of the semiconductor structure 100 and increasing the density of the components.

FIGS. 10-17 are partial cross-sectional views illustrating various stages of a method of manufacturing the semiconductor structure 102 according to some other embodiments of the present disclosure. For example, the stage shown in FIG. 10 may, for example, follow the stage shown in FIG. 1A. Similarly, some components of the semiconductor structure 102 have been omitted from FIGS. 10-17 for simplicity.

Figure 10:
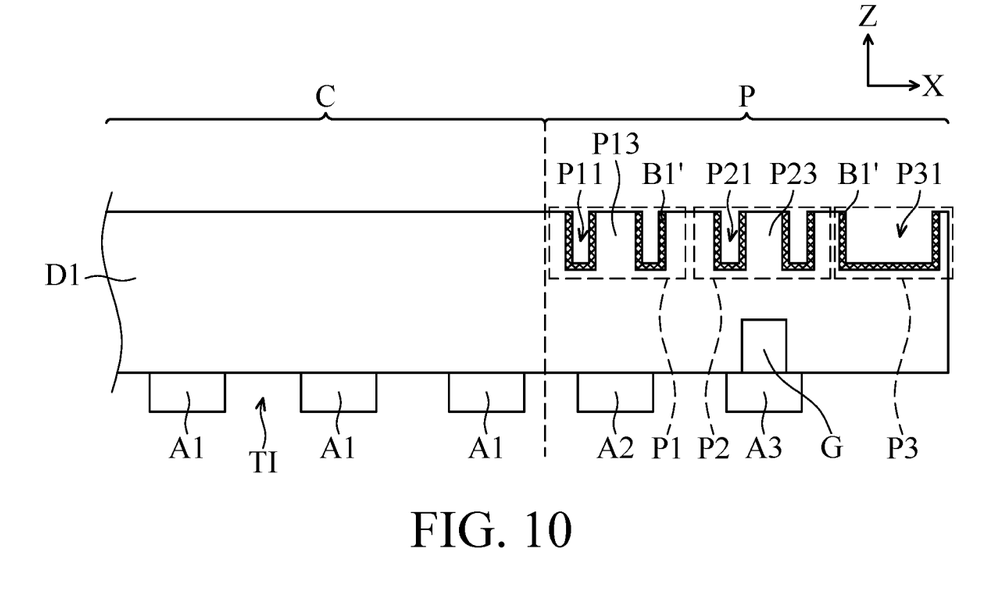
FIGS. 10-17 are partial cross-sectional views illustrating various stages of a method of manufacturing the semiconductor structure according to some other embodiments of the present disclosure.

Referring to FIG. 10, a first barrier layer B1' is formed in the cavity region P11 of the patterned region P1, the cavity region P21 of the patterned region P2, and the cavity region P31 of the patterned region P3. The formation position and formation method of the first barrier layer B1' are similar to the aforementioned first barrier layer B1, and therefore will not be repeated. In this embodiment, the first barrier layer B1' includes tantalum (Ta).

Figure 11:
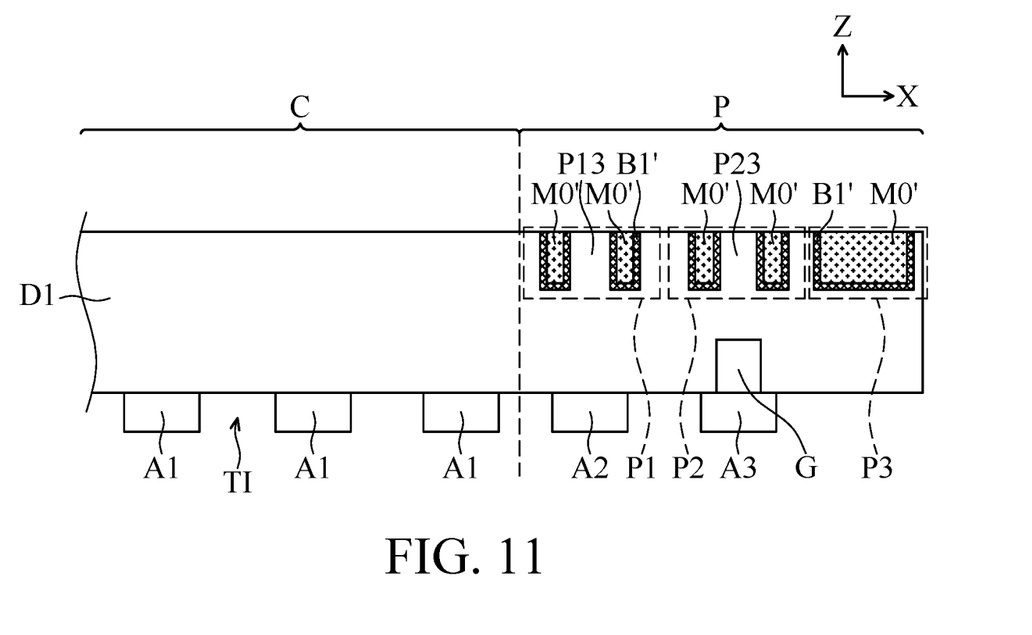

Referring to FIG. 10 and FIG. 11, a filling layer M0' is formed on the first barrier layer B1', and the filling layer M0' fills the cavity region P11, the cavity region P21, and the cavity region P31. In this embodiment, the filling layer M0' includes a spin-on carbon (SOC) material. Similarly, in some embodiments, after the first barrier layer B1' and the filling layer M0' are formed, a planarization process may be performed.

Figure 12:
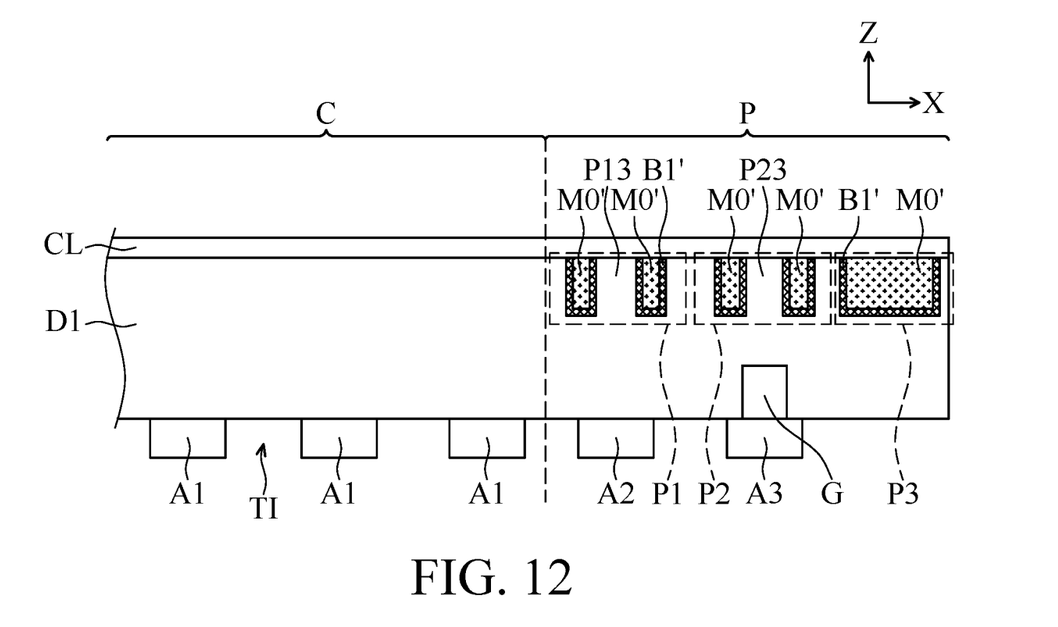
Figure 13:
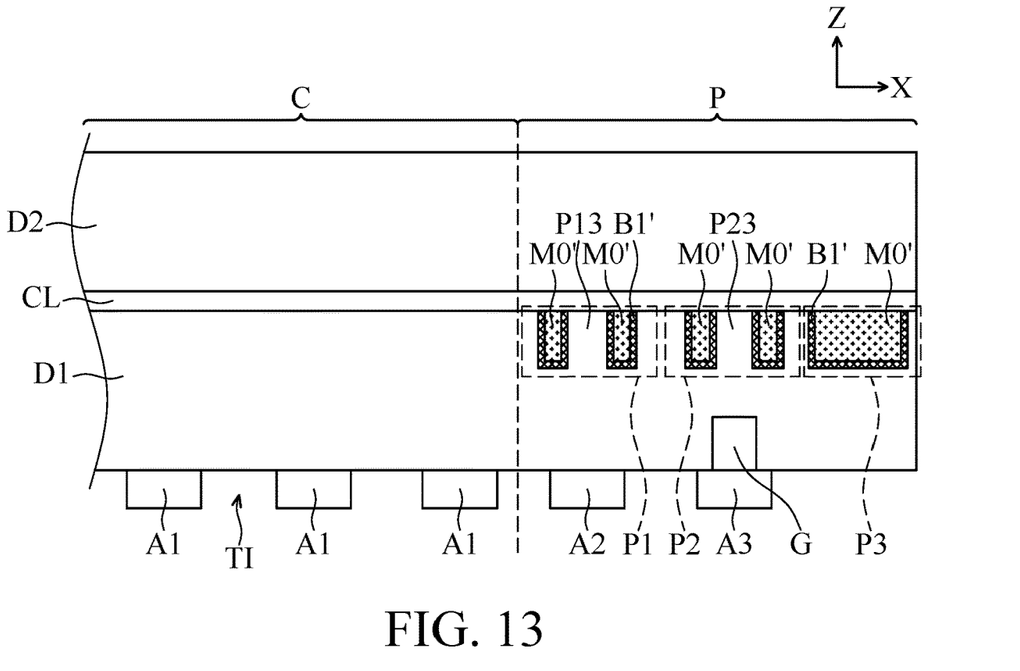
Figure 14:
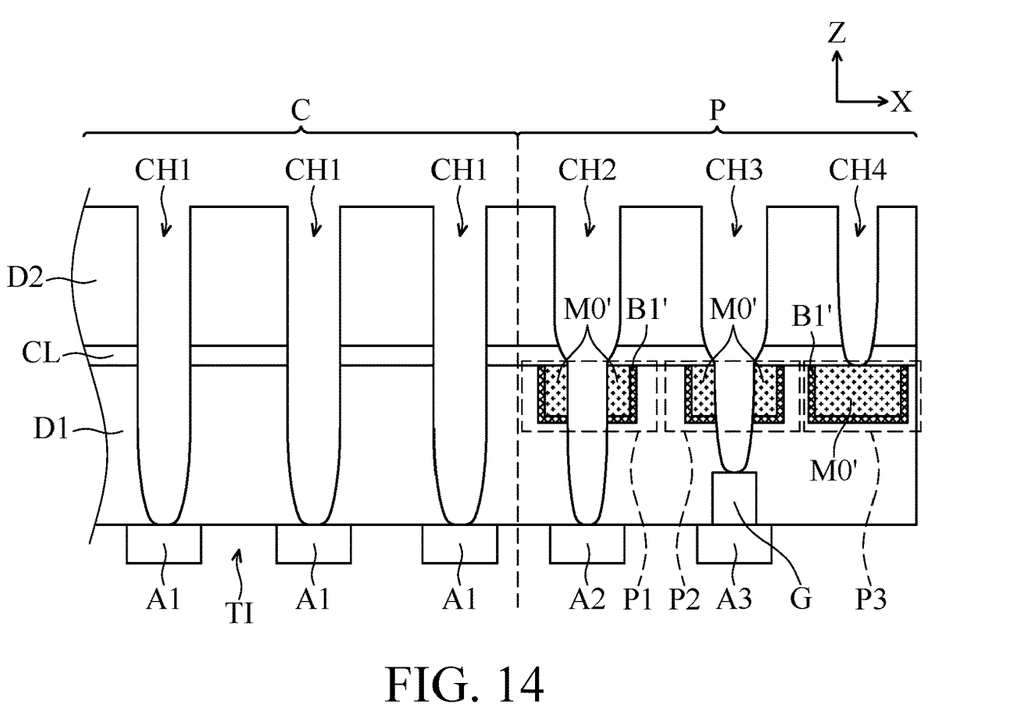

Referring to FIG. 12 to FIG. 14, a cap layer CL is formed on the first dielectric layer D1. For example, the cap layer CL may be formed under the condition that the temperature is lower than the glass transition temperature of the filling layer M0' (e.g., 300° C.), but the present disclosure is not limited thereto. Then, a second dielectric layer D2 is formed on the cap layer CL. Then, multiple first contact holes CH1 and a second contact hole CH2 are formed. As shown in FIG. 14, the first contact holes CH1 and the second contact hole CH2 all penetrate the second dielectric layer D2, the cap layer CL, and the first dielectric layer D1. Each first contact hole CH1 exposes a portion of the corresponding first active area A1, and the second contact hole CH2 further replaces the dielectric region P13 of the patterned region P1 and exposes a portion of the second active area A2.

Similarly, a third contact hole CH3 and a fourth contact hole CH4 are formed. For example, a patterning process may be performed to simultaneously form the first contact holes CH1, the second contact hole CH2, the third contact hole CH3, and the fourth contact hole CH4, but the present disclosure is not limited thereto. The third contact hole CH3 penetrates the second dielectric layer D2, the cap layer CL, and a portion of the first dielectric layer D1, and exposes a portion of the gate structure G. The fourth contact hole CH4 penetrates the second dielectric layer D2 and the cap layer CL, and exposes a portion of the filling layer M0' filled in to the cavity region P31 of the patterned region P3.

Figure 15:
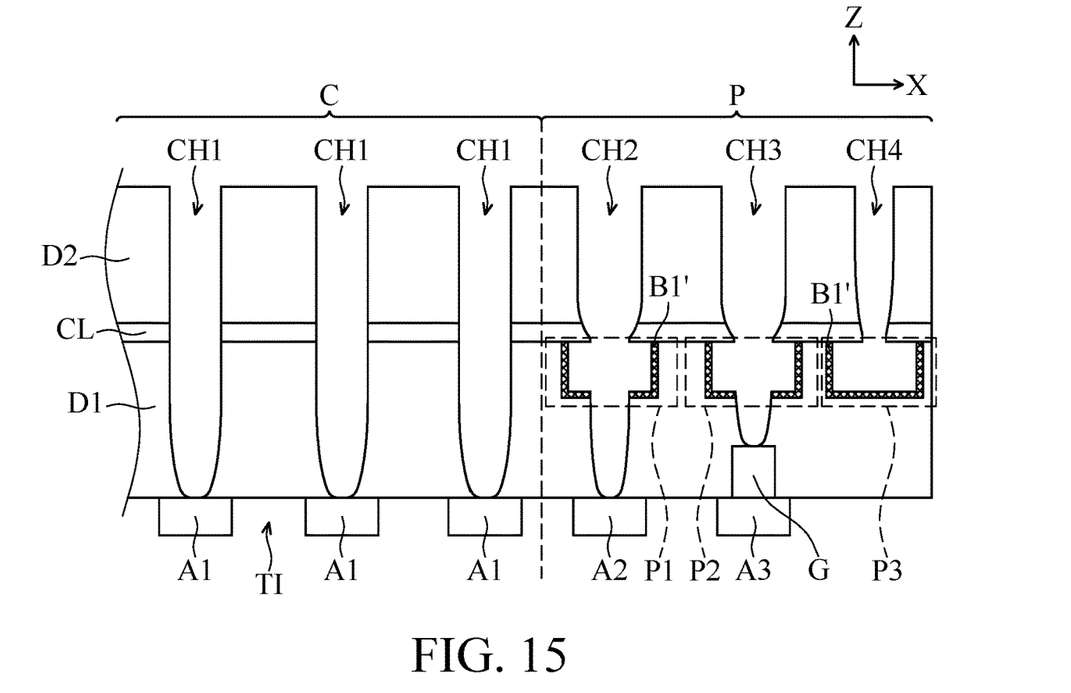

Referring to FIG. 15, the filling layer M0' is removed. For example, the filling layer M0' may be removed from the cavity region P11 of the patterned region P1, the cavity region P21 of the patterned region P2, and the cavity region P31 of the patterned region P3 by a wet cleaning process, but the present disclosure is not limited thereto.

Figure 16:
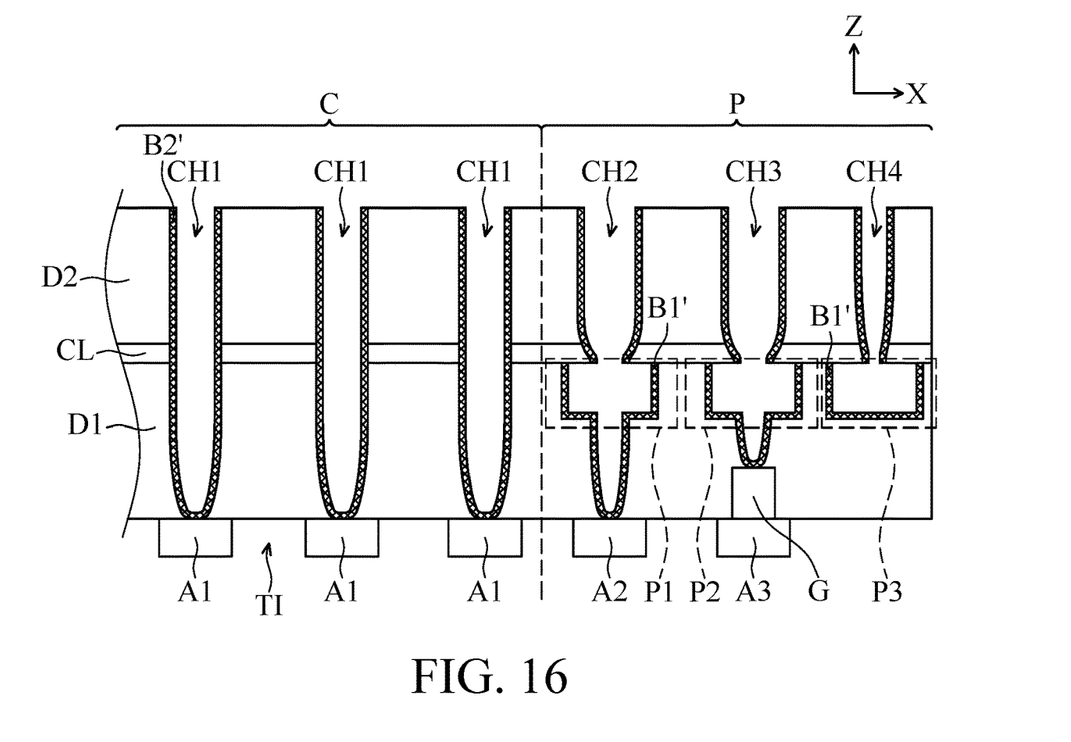

Referring to FIG. 16, a second barrier layer B2' is formed in the first contact holes CH1, the second contact hole CH2, the third contact hole CH3, and the fourth contact hole CH4. Specifically, the second barrier layer B2' may be formed on the sidewalls of the first contact holes CH1, the second contact hole CH2, the third contact hole CH3, and the fourth contact hole CH4. The material and manufacturing method of the second barrier layer B2' may be the same as or similar to that of the first barrier layer B1', but the present disclosure is not limited thereto.

Figure 17:
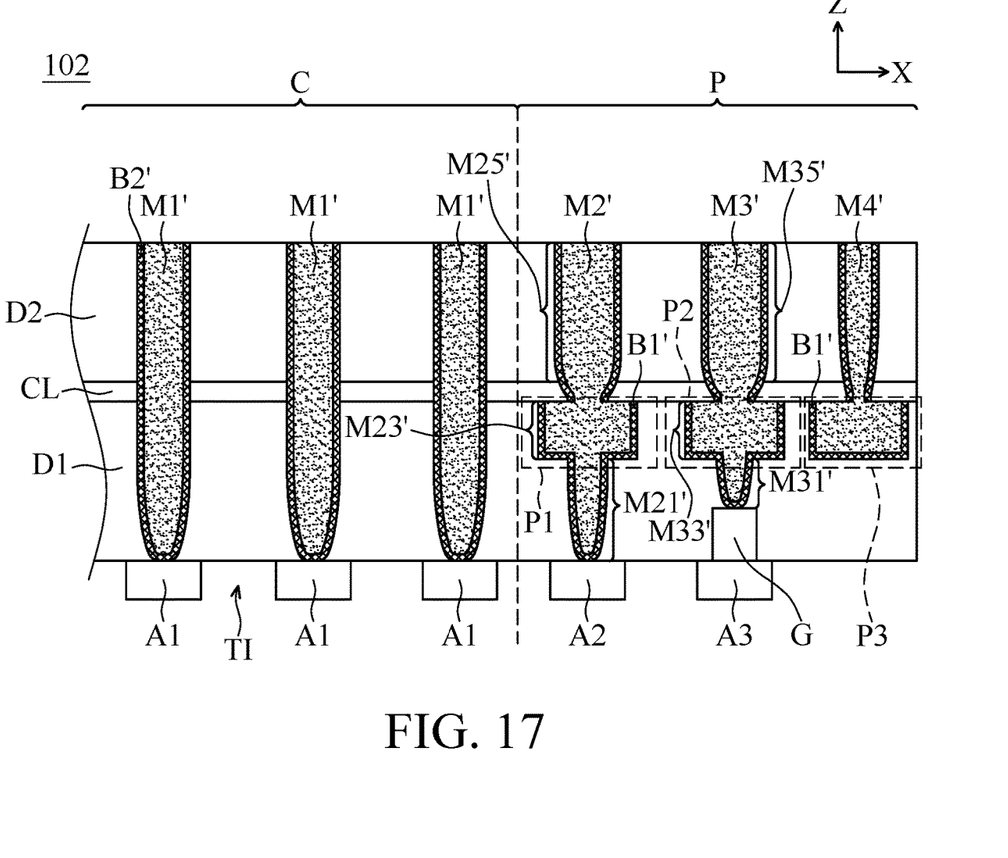

Referring to FIG. 17, metal layers are filled in to the first contact holes CH1, the second contact hole CH2, the third contact hole CH3, and the fourth contact hole CH4. Specifically, as shown in FIG. 17, the metal layers include first metal layers M1', a second metal layer M2', a third metal layer M3', and a fourth metal layer M4', which are respectively formed in the first contact holes CH1, the second contact hole CH2, the third contact hole CH3, and the fourth contact hole CH4.

In other words, in some embodiments, the first metal layers M1' are formed on the second barrier layer B2' and fill the first contact holes CH1; the second metal layer M2' is formed on the second barrier layer B2' and fills the second contact hole CH2 and the cavity region P11 of the patterned region P1; the third metal layer M3' is formed on the second barrier layer B2' and fills the third contact hole CH3 and the cavity region P21 of the patterned region P2; the fourth metal layer M4' is formed on the second barrier layer B2' and fills the fourth contact hole CH4 and the cavity region P31 of the patterned region P3.

In this embodiment, the first metal layers M1', the second metal layer M2', the third metal layer M3', and the fourth metal layer M4' include copper (Cu). In addition, the first metal layers M1', the second metal layer M2', the third metal layer M3', and the fourth metal layer M4' may be respectively formed in the first contact hole CH1, the second contact hole CH2 (and the cavity region P11 of the patterned region P1), the third contact hole CH3 (and the cavity region P21 of the patterned region P2), and the fourth contact hole CH4 (and the cavity region P31 of the patterned region P3) by an electroplating process, but the present disclosure is not limited thereto.

Similarly, as shown in FIG. 17, each first metal layer M1' has a substantially constant width. It should be noted that the bottom of the first metal layer M1' may be gradually narrowed due to process factors (the bottom of the first contact hole CH1 converges). However, other portions of the first metal layer M1' still maintain substantially the same width.

Moreover, as shown in FIG. 17, in some embodiments, the second metal layer M2' includes a first connection portion M21', a filling portion M23', and a second connection portion M25', the first connection portion M21' is connected to the second active area A2, the filling portion M23' is filled in to the patterned region P1 and connected to the first connection portion M21', and the second connection portion M25' is disposed on the filling portion M23' and connected to the filling portion M23'. In other words, the second connection portion M25' of the second metal layer M2 may be electrically connected to the first connection portion M21 by the filling portion M23.

Furthermore, as shown in FIG. 17, in some embodiments, the third metal layer M3' includes a first connection portion M31', a filling portion M33', and a second connection portion M35', the first connection portion M31' is connected to the gate structure G, the filling portion M33' is filled in to the patterned region P2 and connected to the first connection portion M31', and the second connection portion M35' is disposed on the filling portion M33' and connected to the filling portion M33'. In other words, the second connection portion M35' of the second metal layer M3' may be electrically connected to the first connection portion M31' by the filling portion M33'.

In summary, by the manufacturing method of the semiconductor structure according to the embodiments of the present disclosure, the number of processes for forming contact holes may be effectively reduced, thereby reducing the overall process time and cost. Moreover, the manufacturing method of the semiconductor structure according to the embodiments of the present disclosure may provide higher alignment tolerance, thereby effectively reducing the width of the contact hole and the connection line filled therein, so as to reduce the volume of the semiconductor structure and increase the density of the components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

What is claimed is:

1. A manufacturing method of a semiconductor structure, comprising:
    forming first active areas, a second active area, and a third active area, wherein the first active areas define a cell region, and the second active area and the third active area define a peripheral region;
    forming a first dielectric layer on the first active areas, the second active area, and the third active area;
    forming a patterned region in the first dielectric layer, wherein the patterned region comprises a cavity region and a dielectric region, the cavity region surrounds the dielectric region, and the dielectric region corresponds to the second active area;
    forming a filling layer in the cavity region;
    forming a cap layer on the first dielectric layer;
    forming a second dielectric layer on the cap layer;
    forming first contact holes and at least one second contact hole, wherein the first contact holes and the second contact hole penetrate the second dielectric layer, the cap layer, and the first dielectric layer, each of the first contact holes exposes a portion of one of the first active areas, and the second contact hole replaces the dielectric region and exposes a portion of the second active area; and
    filling metal layers into the first contact holes and the second contact hole.

2. The manufacturing method of the semiconductor structure as claimed in claim 1, further comprising:
    forming a gate structure on the third active area.

3. The manufacturing method of the semiconductor structure as claimed in claim 2, wherein another patterned region is formed in the first dielectric layer, and a dielectric region of the another pattering region corresponds to the gate structure.

4. The manufacturing method of the semiconductor structure as claimed in claim 1, wherein before forming the filling layer in the cavity region, the manufacturing method of the semiconductor structure further comprises:
    forming a first barrier layer in the cavity region.

5. The manufacturing method of the semiconductor structure as claimed in claim 4, wherein before forming the metal layers in the first contact holes and the second contact hole, the manufacturing method of the semiconductor structure further comprises:
    forming a second barrier layer in the first contact holes and the second contact hole.

6. The manufacturing method of the semiconductor structure as claimed in claim 5, wherein the first barrier layer and the second barrier layer comprise titanium or titanium nitride, and the filling layer and the metal layers comprise tungsten.

7. The manufacturing method of the semiconductor structure as claimed in claim 5, wherein the filling layer comprises spin-on carbon material.

8. The manufacturing method of the semiconductor structure as claimed in claim 7, wherein after forming the first contact holes and the second contact hole, the manufacturing method of the semiconductor structure further comprises:
    removing the filling layer.

9. The manufacturing method of the semiconductor structure as claimed in claim 7, wherein the first barrier layer and the second barrier layer comprise tantalum, and the metal layers comprise copper.

10. A semiconductor structure, comprising:
   first active areas defining a cell region;
   a second active area and a third active area defining a peripheral region;
   a first dielectric layer disposed on the first active areas, the second active area, and the third active area and comprising a patterned region that corresponds to the second active area;
   a cap layer disposed on the first dielectric layer;
   a second dielectric layer disposed on the cap layer;
   first metal layers penetrating the second dielectric layer, the cap layer, and the first dielectric layer and electrically connected to the first active areas; and
   at least one second metal layer penetrating the second dielectric layer, the cap layer, and the first dielectric layer, and electrically connected to the second active area.

11. The semiconductor structure as claimed in claim 10, wherein each of the first metal layers has a constant width.

12. The semiconductor structure as claimed in claim 10, further comprising:
   a first barrier layer disposed on a sidewall and at least one portion of a bottom of the pattering region; and
   a second barrier layer disposed on a sidewall of each of the first metal layers and at least part of a sidewall of the second metal layer.

13. The semiconductor structure as claimed in claim 12, wherein the second metal layer comprises:
   a first connection portion connected to the second active area;
   a filling portion filled in to the pattering region and connected to the first connection portion; and
   a second connection portion disposed on and connected to the filling portion;
   wherein the second barrier layer is disposed on sidewalls of the first connection portion and the second connection portion.

14. The semiconductor structure as claimed in claim 13, wherein a width of the second connection portion is greater than a width of the first connection portion.

15. The semiconductor structure as claimed in claim 13, wherein the second barrier layer is further disposed on a sidewall of the filling portion.

16. The semiconductor structure as claimed in claim 10, further comprising:
   a gate structure disposed on the third active area.

17. The semiconductor structure as claimed in claim 16, wherein the first dielectric layer comprises another patterned region corresponding to the gate structure.

18. The semiconductor structure as claimed in claim 17, further comprising:
   at least one third metal layer penetrating the second dielectric layer, the cap layer, and a portion of the first dielectric layer, and electrically connected to the gate structure.

19. The semiconductor structure as claimed in claim 10, wherein the first metal layers and the second metal layer comprise tungsten or copper.

* * * * *